United States Patent
Fang

(10) Patent No.: US 7,411,245 B2
(45) Date of Patent: Aug. 12, 2008

(54) SPACER BARRIER STRUCTURE TO PREVENT SPACER VOIDS AND METHOD FOR FORMING THE SAME

(75) Inventor: Chien-Chang Fang, Fongshan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/291,680

(22) Filed: Nov. 30, 2005

(65) Prior Publication Data

US 2007/0122958 A1      May 31, 2007

(51) Int. Cl.
   H01L 21/00   (2006.01)
   H01L 29/788  (2006.01)
(52) U.S. Cl. .............. 257/316; 257/315; 257/E21.62; 257/E21.633; 438/303; 438/305
(58) Field of Classification Search .......... 257/315, 257/316; 438/303, 305
   See application file for complete search history.

(56) References Cited

U.S. PATENT DOCUMENTS

| | | | | |
|---|---|---|---|---|
| 5,069,747 A | * | 12/1991 | Cathey et al. | 438/696 |
| 6,232,640 B1 | * | 5/2001 | Okada et al. | 257/374 |
| 6,346,449 B1 | * | 2/2002 | Chang et al. | 438/305 |
| 6,436,792 B1 | * | 8/2002 | Yamaguchi et al. | 438/432 |
| 6,512,266 B1 | * | 1/2003 | Deshpande et al. | 257/333 |
| 2005/0112834 A1 | * | 5/2005 | Jin et al. | 438/303 |

* cited by examiner

*Primary Examiner*—Dao H. Nguyen
(74) *Attorney, Agent, or Firm*—Duane Morris LLP

(57) ABSTRACT

A semiconductor device includes a spacer adjacent a gate structure. A protection layer covers oxide portions of the spacer surface such that subsequent manufacturing operations such as wet oxide etches and strips, do not produce voids in the spacers. A method for forming the semiconductor device provides forming a gate structure with adjacent spacers including an oxide liner beneath a nitride section, then forming the protection layer over the structure, and removing portions of the protection layer but leaving other portions of the protection layer intact to cover and protect underlying oxide portions of the spacer during subsequent processing such as the formation and removal of a resist protect oxide (RPO) layer. The protection layer is advantageously formed of a nitride film and an oxide film and produces a double spacer effect when partially removed such that only vertical sections remain.

17 Claims, 5 Drawing Sheets

SPACER BARRIER STRUCTURE TO PREVENT SPACER VOIDS AND METHOD FOR FORMING THE SAME

FIELD OF THE INVENTION

The present invention relates, most generally, to semiconductor devices and methods for manufacturing such devices. More particularly, the present invention relates to a method and structure for preventing void formation in spacers commonly used along gate structures in semiconductor devices.

BACKGROUND

In today's rapidly advancing semiconductor manufacturing industry, there is a push for higher and higher levels of integration and smaller and smaller device features. Various structures and techniques have been developed to enable the increased levels of integration. For example, spacers are typically used alongside (transistor) gate structures formed on semiconductor substrates, to isolate gate contacts from source and drain contacts. Spacers formed of both an oxide liner and a bulk nitride portion are commonly favored in today's semiconductor manufacturing industry. One particularly favored spacer includes an "L-shaped" oxide liner that typically extends along the side of the gate structure and on the semiconductor substrate beneath a nitride portion, with the nitride portion forming the greater portion of the spacer. Various techniques have been developed which enable the production of gate structures of smaller dimensions and associated spacers.

When the other processes used in semiconductor manufacturing operations, however, attack the gate structure and/or the spacers, device integrity and device yield are compromised and device failure may be the result. For example, an RPO is commonly formed over gate structures including the spacers, to protect the underlying structure during subsequent processing operations performed on the other structures of the semiconductor substrate. The RPO may be patterned to expose portions of the underlying structures to be silicided, while protecting other portions from being silicided, for example. The etching processes used to pattern the RPO may attach underlying structures such as oxide portions of spacers. Additionally, the RPO must eventually be removed, typically using a combination of dry and wet processing operations that preferentially attack oxides. When the RPO is etched or removed from over a conventional gate structure using conventional processing operations, underlying oxides may be attached and voids or divots may be produced at the corners of spacer structures in which the oxide liner extends to the outer spacer surface. In particular, when voids occur along the oxide liner formed as the bottom portion of a spacer, and which lies along the semiconductor substrate surface, the voids can result in leakage when subsequent implanting operations, silicidation operations or other similar operations are carried out. Such leakage can cause device failures, or at the least, degrade yield and compromise device integrity.

It would therefore be desirable to produce a gate structure including a spacer, that includes an oxide liner that is immune to damage when an RPO layer is formed over the structure, patterned, and subsequently removed.

SUMMARY OF THE INVENTION

To achieve these and other objects and in view of its purposes, the present invention provides, in one aspect, a method for forming a semiconductor device comprising providing a semiconductor substrate and forming a gate structure on the surface of the semiconductor substrate. The method further includes forming at least one spacer along a corresponding side of the gate structure, the spacer including a spacer oxide portion and a spacer nitride portion. The method further includes forming a protection layer over the gate structure and the at least one spacer and etching to remove portions of the protection layer but leaving further portions of the protection layer in place such that no portions of the spacer oxide portion are exposed.

In another aspect, the invention provides a semiconductor device comprising a gate structure disposed over a substrate surface of a semiconductor substrate. The device includes at least one inner spacer disposed over the substrate surface and along a corresponding side of the gate structure. The inner spacer includes at least one spacer oxide portion and a spacer nitride portion. The inner spacer has an outer surface with at least one spacer oxide surface portion, and the semiconductor device also includes an outer spacer covering each spacer oxide surface portion and formed of an oxide layer and a nitride layer.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

Figure 1:
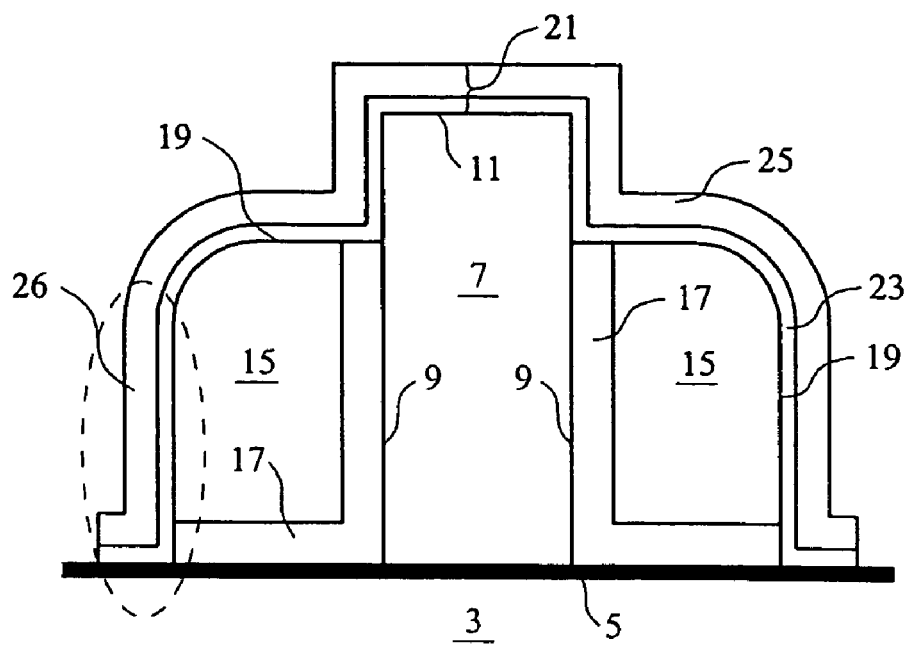
FIGS. 1-7 are cross-sectional views illustrating a process sequence according to the method of the invention and further illustrating device embodiments of the invention.
Figure 2:
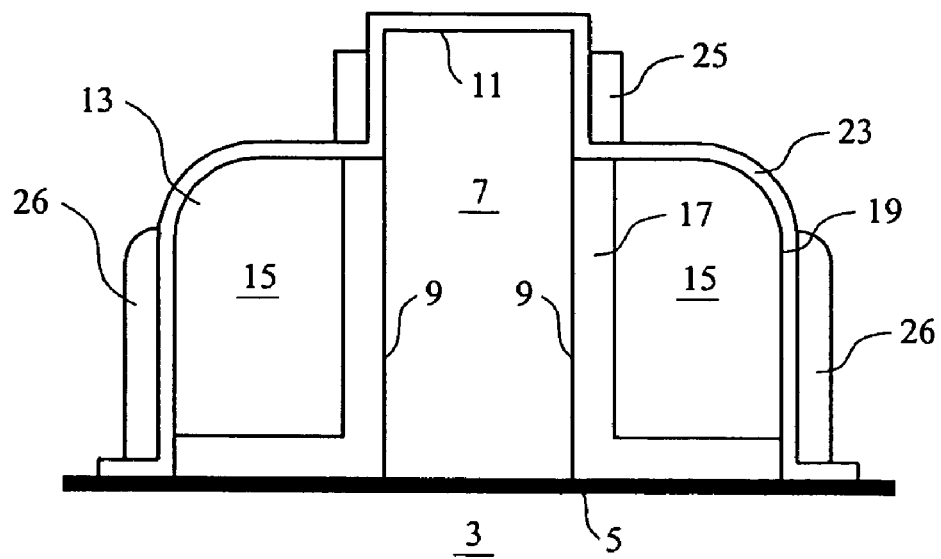
Figure 3:
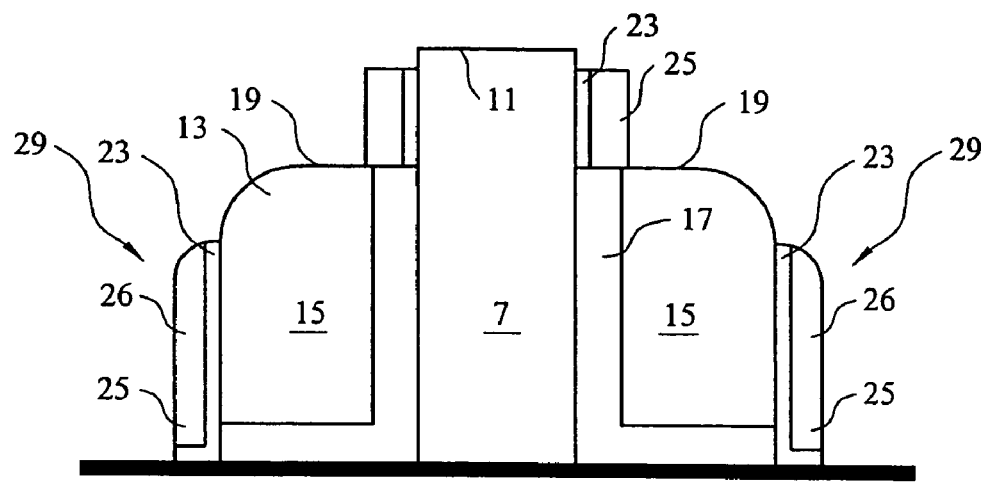
Figure 4:
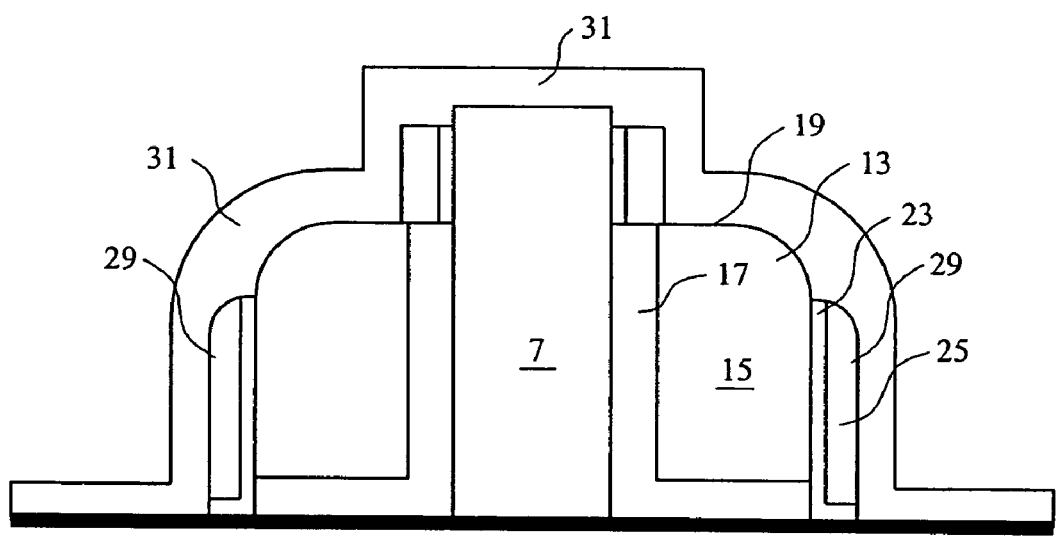
Figure 5:
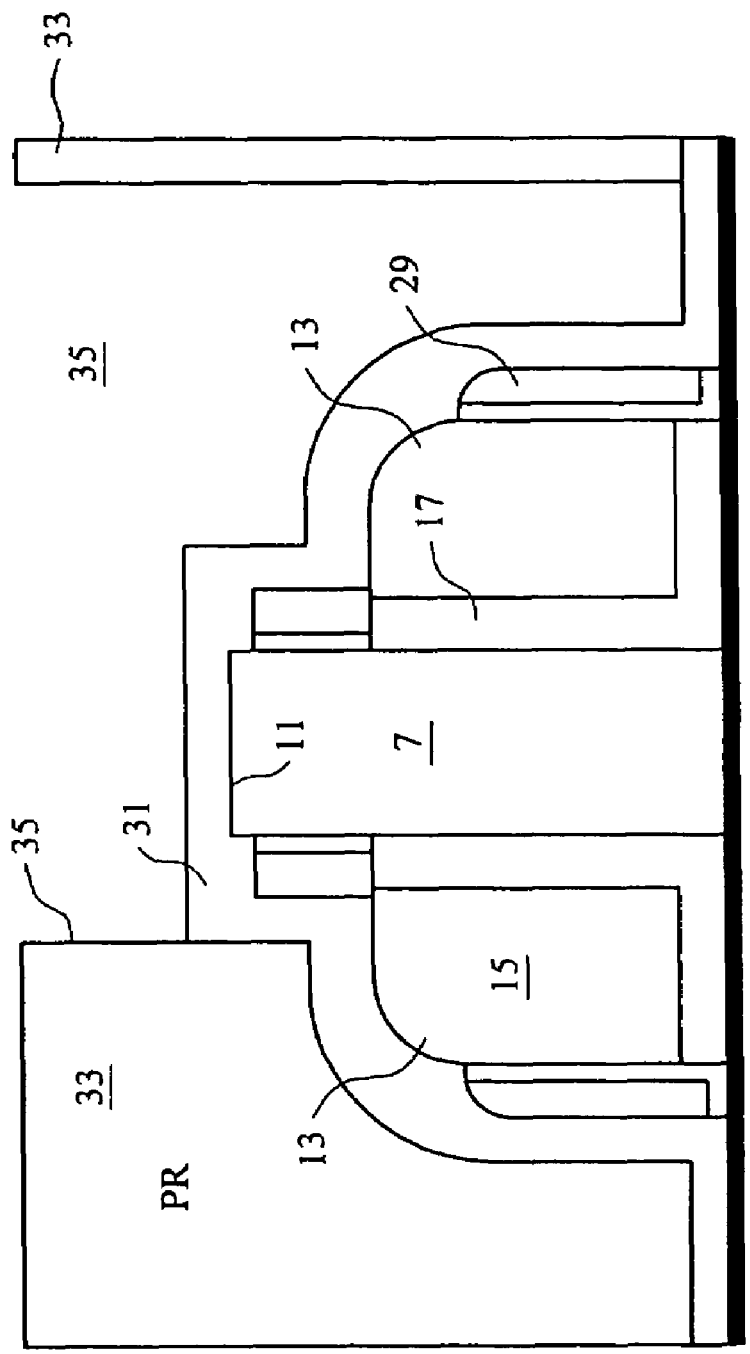
Figure 6:
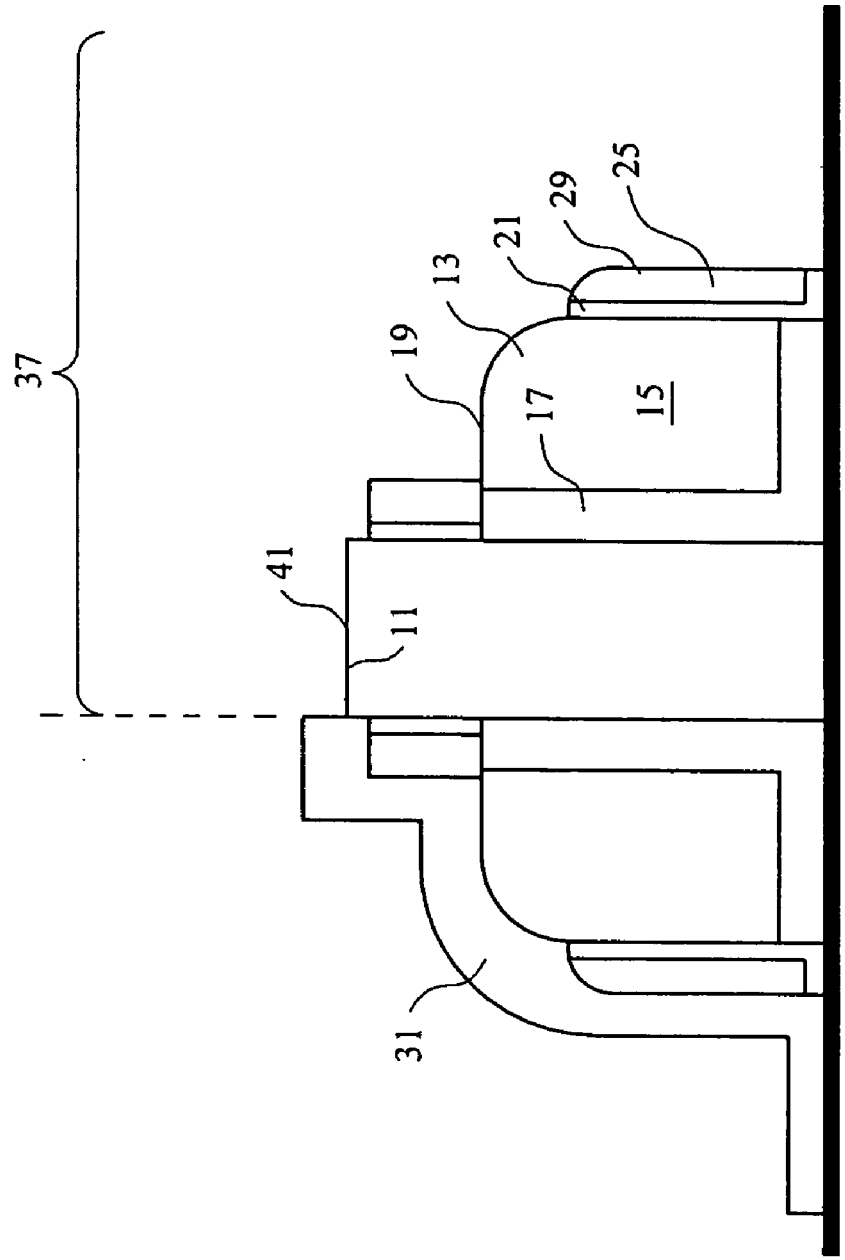
Figure 7:
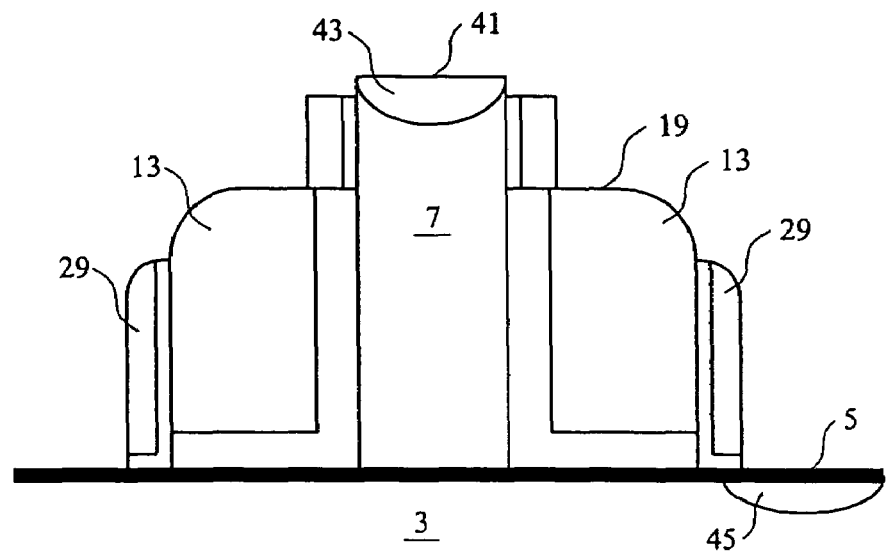

In particular,

FIG. 1 shows a gate structure with spacers covered by a protection layer;

FIG. 2 shows the structure of FIG. 1 after portion of the protection layer has been removed;

FIG. 3 shows the structure of FIG. 2 after outer spacers have been formed from the protection layer;

FIG. 4 shows the structure of FIG. 3 after an RPO layer has been formed over the structure;

FIG. 5 shows the structure of FIG. 4 with a photoresist pattern formed thereover;

FIG. 6 shows the structure of FIG. 5 after it has been etched to remove the RPO layer in exposed areas; and FIG. 7 shows the structure of FIG. 6 after RPO removal and silicidation.

Figure 8:
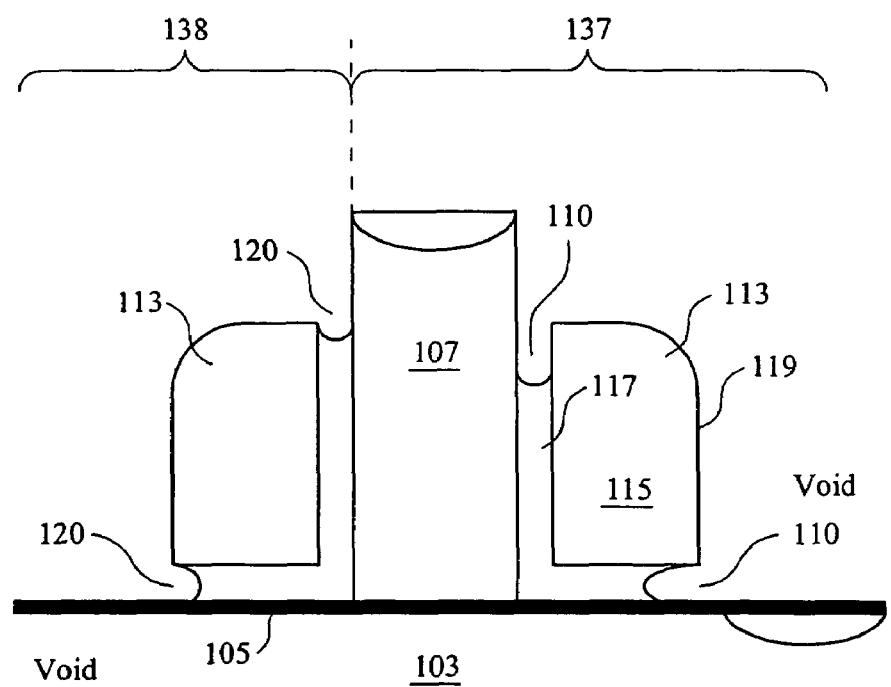

FIG. 8 is a cross-sectional view with similarities to the structure shown in FIG. 7, but according to the PRIOR ART and including undesirable voids/divots therein.

DETAILED DESCRIPTION

The present invention provides a method and structure that protects conventional spacers that include an oxide portion, during subsequent oxide removal operations which, using conventional technology, result in attack of the oxide portion and may create voids or divots at locations where the oxide portions intersect the outer surface of the spacer. The present invention prevents any attack of the oxide liner portion of the conventional spacer during such subsequent oxide removal operations, by providing outer spacers that cover the otherwise exposed portions of the oxide liner of the conventional spacer. It may be stated that the present invention provide an inner spacer adjacent gate structure and an outer spacer adjacent the inner spacer.

FIG. 1 shows gate structure 7 formed over surface 5 of substrate 3. Conventional semiconductor substrates such as silicon, gallium arsenide, or other suitable materials, may be used as substrate 3. Gate structure 7 may be formed of polysilicon or other suitable materials and includes sides 9 and top 11. Adjacent each of opposed sides 9 are spacers 13. Spacers 13 include a nitride portion and an oxide portion and in the illustrated embodiment spacers 13 each include a bulk nitride portion 15 and underlying oxide portion 17. Nitride portion 15 may be silicon nitride in stoichiometric or other ratios but other nitrides may be used in other embodiments. Oxide portion 17 may be an $SiO_2$ liner formed using a TEOS (tetraethyl orthosilicate) precursor in one exemplary embodiment, but other oxide liners may be used in other exemplary embodiments. The dimensions of gate structure 7 and the components of spacer 13 may vary according to application and levels of device integration, in various exemplary embodiments. Spacers 13 include curved outer surface 19 which extends from surface 5 to side 9 but outer surface 19 does not extend up to top 11. Although oxide portion 17 is a generally "L-shaped" liner in the illustrated embodiment, it should be understood that such is exemplary only, and in other exemplary embodiments, various other structural examples of oxide portion 17 and nitride portion 15 may be used. For example, spacer 13 may include multiple oxide portions 17.

Covering gate structure 7 and spacers 13 is protection layer 21 which consists of nitride layer 25 formed over oxide layer 23 in the illustrated exemplary embodiment. Protection layer 21 may consist of various other arrangements of films in other exemplary embodiments. Protection layer 21 includes vertical portion 26. Protection layer 21 may also be referred to as a barrier structure Nitride layer 25 may be formed of various suitable materials such as stoichiometric or other silicon nitrides and oxide layer 23 may be formed of various suitable materials such as silicon dioxide.

A conventional spacer dry etching process may be used to remove comparatively thin portions of nitride layer 25, leaving thicker vertical portions 26 of nitride layer 25. An anisotropic etch process may be advantageously used. The selective etching process does not appreciably remove even the exposed portions of oxide layer 23. The structure in FIG. 2 then undergoes an oxide removal etching operation such as an HF (hydrofluoric acid) wet dip to remove exposed portions of oxide layer 23 and produce the structure shown in FIG. 3.

In FIG. 3, top 11 of gate structure 7 is exposed and portions of outer surface 19 of spacer 13 are also exposed. FIG. 3 also illustrates an aspect of the invention that no portions of oxide portion 17 are exposed. Rather, at the locations where oxide portion 17 forms part of outer surface 19, spacer 13 is covered by remaining portions of protection layer 21, i.e., nitride layer 25 and oxide layer 23. In essence, vertical portions 26 serve as spacers and therefore FIG. 3 shows outer spacers 29 that are disposed outside spacers 13 which therefore serve as inner spacers.

Although not illustrated in the figures, it should be understood that conventional source/drain regions may be formed in surface 5 of substrate 3 beneath spacers 13 and outer spacers 29 and extending essentially inwardly to about the intersection of sides 9 of gate structure 7, and substrate 5. Conventional methods such as self-aligned techniques may be used to form the source/drain region after definition of gate structure 7 and prior to formation of the films that form spacer 13.

FIG. 4 shows RPO (resist protect oxide) layer 31 formed over the structure previously shown in FIG. 3. Various formation methods may be used and RPO layer 31 may be pure stoichiometric silicon dioxide or other suitable oxide films. RPO layer 31 may be formed to various thicknesses and is formed over gate structure 7, spacers 13 and outer spacers 29. In the illustrated embodiment, RPO layer 31 is formed on outer surface 19, but additional intermediate films may be used in other exemplary embodiments FIG. 5 shows the structure of FIG. 4 after a conventional photoresist film 33 has been formed over the structure in FIG. 4 then developed, i.e. patterned, to form opening 35 in which RPO layer 31 is exposed. Conventional methods may be used.

FIG. 6 shows the structure of FIG. 5 after an etching procedure has been used to remove portions of RPO layer 31 exposed in opening 35 and not covered by photoresist layer 33, and after the etching procedure has been followed by a subsequent photoresist removal process to remove photoresist layer 33. Various etching procedures may be used. In one embodiment, a dry etching procedure may be followed by a wet etching procedure. FIG. 6 shows uncovered portion 37 in which RPO layer 31 has been removed exposing portions of outer spacer 29 including oxide layer 21, outer surface 19 and surface 41 formed at top 11 of gate structure 7. Because no portions of oxide portion 17 are exposed to the oxide wet etching solution used to remove RPO layer 31, structural integrity is maintained as protected oxide portions 17 are not attacked. The locations on spacer 13 where oxide portion 17 intersects outer surface 19, are divot-free. A silicidation process may then be carried out on the structure shown in FIG. 6.

FIG. 7 shows the structure of FIG. 6 after silicidation has taken place on portions of exposed silicon not covered by RPO layer 31, and after remaining portions of RPO layer 31 have been subsequently removed. For example, silicide 43 is formed in top surface 41 of gate structure 7 and silicide 45 is formed in surface 5 of substrate 3 in locations not covered by gate structure 7, spacer 13 or outer spacer 29. Silicide 45 may advantageously provide contact to a source/drain layer formed in that region of the substrate 3 and extending laterally to gate structure 7. The silicidation process may be a conventional process in which a metal film such as cobalt or titanium is formed over the structure, and annealed to engender the silicidation of the metal film with exposed silicon portions. The unreacted metal portions are then removed.

The remaining portions of RPO layer 31 are then removed using conventional oxide stripping operations, typical, wet isotropic processes. Again, since oxide portion 17 of spacers 13 are not exposed, oxide portions 17 are not attacked during the oxide stripping operation used to remove RPO layer 31.

In comparison, FIG. 8 shows a comparable structure according to the prior art but a structure in which novel protection layer 21 (oxide layer 23 and nitride layer 25) was not used. Spacers 113 of gate structure 107 formed on surface 105 of substrate 103, include large divots 110 (i.e., voids) at locations where oxide portions 117 are coextensive with outer surface 119 within region 137 from which an RPO layer (not shown) was initially removed and smaller divots 120 (i.e., voids) in region 138 in which the RPO layer was not etched away but only removed later by stripping. Larger voids 110 are greater than smaller divots 120 because they represent portions of oxide portion 117 that were exposed during two wet operations used to remove oxide materials.

An advantage of the inventive structure such as shown in FIG. 7 is that such divots are not present because oxide portions 17 are protected from the wet etching solutions used to initially etch and then remove the RPO layer 31.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the device be formed or used in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor device comprising a gate structure disposed over a substrate surface of a semiconductor substrate, at least one inner spacer disposed over said substrate surface and along a corresponding side of said gate structure and including at least one spacer oxide portion and a spacer nitride portion,
    said inner spacer having an outer surface with at least one spacer oxide surface portion and in contact with a plurality of discrete outer spacers, and
    each said discrete outer spacer being substantially vertical and formed of an oxide layer and a nitride layer,
    each said spacer oxide surface portion covered by a corresponding one of said discrete outer spacers and wherein each said discrete outer spacer does not contact any other of said discrete outer spacers.

2. The semiconductor device as in claim 1, wherein said at least one spacer oxide portion comprises an oxide liner having a horizontal portion disposed beneath said spacer nitride portion and terminating in a first said spacer oxide surface portion, and a vertical portion disposed between said spacer nitride portion and said side and terminating in a second said spacer oxide surface portion.

3. The semiconductor device as in claim 2, wherein said discrete outer spacer that covers said first spacer oxide surface portion, is disposed on said substrate surface.

4. The semiconductor device as in claim 1, wherein at least one said discrete outer spacer intersects said substrate surface at an intersection, said intersection being divot-free.

5. The semiconductor device as in claim 1, wherein said outer surface intersects said substrate surface at an intersection, said intersection being divot-free.

6. The semiconductor device as in claim 1, wherein said oxide layer is disposed between said nitride layer and said gate structure, said outer surface of said inner spacer is substantially curved and extends from said substrate surface to said side but not extending to a top of said gate structure, a first said discrete outer spacer is disposed above said inner spacer and along said side, and a second said discrete outer spacer is disposed on said substrate surface.

7. The semiconductor device as in claim 1, further comprising a silicide formed on a top of said gate structure and in portions of said substrate surface not covered by said gate structure, said inner spacer or said discrete outer spacers.

8. The semiconductor device as in claim 1, further comprising at least one source/drain region formed in said surface and terminating laterally at about said gate structure.

9. A method for forming a semiconductor device comprising:
    providing a semiconductor substrate;
        forming a gate structure on a substrate surface of said semiconductor substrate;
        forming a spacer along a corresponding side of said gate structure, said spacer including a spacer oxide portion and a spacer nitride portion and having an outer surface including a duality of spacer oxide surface portions;
        forming a protection layer over said gate structure and said spacer,
    wherein said protection layer comprises an oxide layer and a nitride layer; and
        etching to remove first portions of said protection layer thereby creating a plurality of discrete outer spacers from said protection layer such that each said spacer oxide surface portion is covered by a corresponding one of said discrete outer spacers, each said discrete outer spacer not contacting any other of said discrete outer spacers.

10. The method as in claim 9, wherein said discrete outer spacers comprise a duality of substantially vertical portions.

11. The method as in claim 9, wherein said etching comprises a dry nitride etch followed by a wet oxide etch.

12. The method as in claim 9, wherein said spacer includes a substantially curved outer surface extending from said substrate surface to said side but not extending to a top of said gate structure, each of said outer spacers is a generally vertical portion, and said spacer oxide portion includes an oxide liner having a horizontal portion disposed beneath said spacer nitride portion and terminating in a first of said duality of spacer oxide surface portions, and a vertical portion disposed between said spacer nitride portion and said side and terminating in a second of said duality of spacer oxide surface portions.

13. The method as in claim 9, wherein said spacer comprises said spacer oxide portion being an oxide liner having a horizontal portion disposed beneath said spacer nitride portion and terminating in a first of said duality of spacer oxide surface portions, and a vertical portion disposed between said spacer nitride portion and said side and terminating in a second of said duality of spacer oxide surface portions.

14. The method as in claim 13, wherein said spacer oxide portion comprises a TEOS film and further comprising forming a resist protect oxide (RPO) layer over said gate structure and said spacer after said etching, then removing said RPO layer from over said spacer by wet etching and wherein said outer surface is substantially divot-free after said wet etching.

15. The method as in claim 9, wherein said gate structure includes silicon, and further comprising forming a metal film over said gate structure, said spacer and said substrate surface, heating to urge silicidation of said gate structure and said metal film and silicidation of contact portions of said substrate surface and said metal film, and removing un-silicided portions of said metal film.

16. The method as in claim 15, further comprising, prior to said forming a metal film,
   forming a resist protect oxide (RPO) layer on said gate structure, said spacer and said semiconductor substrate, and removing said RPO layer from over said spacer, said gate structure and said contact portions of said substrate surface by wet etching.

17. A method for forming a semiconductor device compriswing:
   providing a semiconductor substrate;
   forming a gate structure on a substrate surface of said semiconductor substrate, said gate structure including silicon;
   forming a spacer along a corresponding side of said gate structure, said spacer including a spacer oxide portion and a spacer nitride portion and having an outer surface including at least one spacer oxide surface portion;
   forming a protection layer over said gate structure and said spacer;
   etching to remove first portions of said protection layer but leaving further portions of said protection layer such that each said spacer oxide surface portion is covered by a corresponding one of said further portions;
   forming a resist protect oxide (RPO) layer on said gate structure, said spacer and said substrate surface, and removing said RPO layer from over said spacer, said gate structure end contact portions of said substrate surface by wet etching;
   forming a metal film over said gate structure, said spacer and said substrate surface;
   heating to urge silicidation of said gate structure and said metal film and silicidation of contact portions of said substrate surface and said metal film;
   removing un-silicided portions of said metal film; and
   stripping said RPO layer from non-contact portions of said substrate surface using a second wet etching, wherein said outer surface is substantially divot-free after said second wet etching after said removing said RPO layer.

* * * * *

UNITED STATES PATENT AND TRADEMARK OFFICE
CERTIFICATE OF CORRECTION

PATENT NO. : 7,411,245 B2  Page 1 of 1
APPLICATION NO. : 11/291680
DATED : August 12, 2008
INVENTOR(S) : Chien-Chang Fang It is certified that error appears in the above-identified patent and that said Letters Patent is hereby corrected as shown below:

Column 7, lines 15-16, in Claim 17, replace "compriswing" with --comprising--

Column 8, line 10, in Claim 17, replace "end" with --and--

Signed and Sealed this

Thirty-first Day of March, 2009

JOHN DOLL
*Acting Director of the United States Patent and Trademark Office*